United States Patent [19]

Yamaoka

[11] Patent Number: 5,747,999
[45] Date of Patent: May 5, 1998

[54] FEED CONTROL ELEMENT USED IN SUBSTRATE INSPECTION AND METHOD AND APPARATUS FOR INSPECTING SUBSTRATES

[75] Inventor: Syuuzi Yamaoka, Fukuyama, Japan

[73] Assignee: Okano Hitech Co., Ltd., Hiroshima, Japan

[21] Appl. No.: 512,066

[22] Filed: Jul. 7, 1995

[30] Foreign Application Priority Data

Aug. 15, 1994 [JP] Japan .................................. 6-225484
Feb. 21, 1995 [JP] Japan .................................. 7-057949

[51] Int. Cl.$^6$ ............................................. G01R 31/308
[52] U.S. Cl. ......................... 324/501; 324/537; 324/752
[58] Field of Search ................................. 324/501, 537, 324/702, 750, 752

[56] References Cited

U.S. PATENT DOCUMENTS 4,843,329  6/1989  Beha et al. .......................... 324/501 X
4,970,461 11/1990  LePage ................................. 324/752
5,057,773 10/1991  Golladay et al. .................... 324/501 X
5,394,098  2/1995  Meyrueix et al. ..................... 324/750
5,404,110  4/1995  Golladay ............................. 324/751
5,442,714  8/1995  Iguchi ............................... 324/501 X
5,519,334  5/1996  Dawson .............................. 324/765
5,548,211  8/1996  Tujide et al. ...................... 324/750 X Primary Examiner—Glenn W. Brown
Attorney, Agent, or Firm—Koda and Androlia

[57] ABSTRACT

A non-contact voltage feeding apparatus for inspecting a circuit pattern on a substrate. The feeding apparatus includes a feed control element having a laminated structure as a light probe. A voltage is applied to the light probe disposed on the feeding side of the circuit pattern to be inspected by irradiating the light probe with a laser beam. An electrostatic capacitance coupling under a non-contact system is provided on the detection side, and an electrical condition of the coupling is extracted from the circuit and a waveform processing is performed on the detected signals so as to make it possible to test respective conductive paths of the circuit pattern.

6 Claims, 7 Drawing Sheets

IN NORMAL

WHEN SHORT-CIRCUITED

WHEN WIRE DISCONNECTED

FEED CONTROL ELEMENT USED IN SUBSTRATE INSPECTION AND METHOD AND APPARATUS FOR INSPECTING SUBSTRATES

BACKGROUND OF THE INVENTION

1. Field of the Invention

The present invention relates to a voltage feed control element for substrate inspection, as well as a substrate inspection method and substrate inspection apparatus, with an improved voltage feeding system in which voltage is fed individually to circuit patterns which are formed on the substrates which are to be inspected by irradiation of laser light so as to detect defects in the circuit patterns.

2. Prior Art

In conventional inspection methods and apparatuses used for inspecting the electronic circuit substrates, etc., connection pins for electrical feeding and receiving are used for each of the electrodes to be inspected; and inspection is accomplished by performing electrical feeding and receiving and ascertaining whether or not a signal is received from each electrode inspected. Furthermore, a positioning device is required in order to perform this probing in a reliable manner.

In recent years, electronic devices have become smaller and lighter; therefore, there has been an abrupt increase in the density of electronic circuit substrates (substrates to be inspected) and a much narrower spacing between mounted IC's, etc. Accordingly, requirements of working characteristics, reliability, cost, etc. in substrate inspections capable of responding to such changes have also become increasingly important.

As the spacing in the circuit patterns becomes narrower, the number of power input and output points increases, and testing requirements to the circuit patterns become much more severe. Accordingly, it is necessary to use a complex and highly precise inspection jig, which results in a cost increase.

Meanwhile, attempts have been made to solve the problems by utilizing electron beams or laser technology to reduce or eliminate physical contact with the circuit patterns. However, tests of this type are limited in that they must be performed in a vacuum or in a low-pressure inert atmosphere.

On the whole, problems which are common to both contact type and non-contact type inspection systems is considered to be in the probing which is linked with the electrical feeding system. Thus, there is a demand for a new, improved feeding system (means) which is able to keep up with the evolution of electronic circuit substrates.

Examples of technical problems which should be solved by the present invention include the following:

(1) The inspection should be performed in AN ordinary atmosphere.

(2) A special pretreatment such as coating, etc. on the substrates to be inspected should be unnecessary.

(3) The detecting elements and the substrate to be inspected should be in the same circuit loop, and the circuit current should be directly detected.

(4) The inspection operation should be performed under low-voltage conditions.

Accordingly, the object of the present invention is to solve the problems by providing a newly improved feeding system in substrate inspections that uses laser light and is to provide a feed control element used in substrate inspection as well as a substrate inspection method and substrate inspection apparatus which allow efficient inspections to be made for locating defects such as short circuit patterns and improper mounting of circuit components connected to the patterns, thus contributing to a shortening of product completion time and a reduction of costs in inspection (apparatuses).

Furthermore, the present invention proposes that the substrate inspection method thereof can be used for both contact and non-contact type inspection systems.

SUMMARY OF THE INVENTION

The first invention for accomplishing the object is a feed control element for substrate inspection which is designed so that individual feeding is accomplished by forming an electrostatic capacitive coupling between the feed control element and a circuit pattern that is to be inspected so that a voltage is applied to the circuit pattern to be detected by irradiating a pulse-modulated laser beam.

The structure of the feed control element is a laminated body that is composed of a glass base 11, a transparent electrode 12, a light conductive film 13 or resistance film 14 which includes an insulating gap 17, an anisotropic conductor 15 and an insulator 16.

Furthermore, the second invention is a substrate inspection method wherein: a feeding side and a detection side are established by forming respective electrostatic capacitive couplings at both ends of a circuit pattern to be inspected; a voltage is applied to the circuit pattern to be inspected by irradiating the circuit pattern with a pulse-modulated laser beam through the feeding-side electrostatic capacitive coupling; an electrical status of the detection-side electrostatic capacitive coupling is extracted from the circuit; and the status of the respective conductive paths of the circuit pattern is tested by subjecting the detected signals to waveform processing.

The second invention is characterized by the fact that in the non-contact type feeding system, the feed control element is installed at one end of the circuit pattern to be inspected, and individual feeding to such a circuit pattern to be inspected is performed by scanning a pulse-modulated laser beam, whose light spot, area of illumination, is sufficiently smaller than the pitch or trace interval of the circuit pattern to be inspected, onto the light conductive film of the feed control element through the transparent electrode.

Furthermore, the third, fourth and fifth inventions are substrate inspection apparatuses that constitute technical means for realizing the substrate inspection method described above.

The characteristic structure of the inspection apparatus is that it includes a feed control means which is the feed control element described above, a pulse-modulated laser beam irradiation means, a signal detection means and a waveform processing means.

Furthermore, the apparatus may include an external computer that executes a pulse-modulated laser beam irradiation control and constitutes a secondary processing system for waveform processing that includes data processing.

In addition, the sixth invention is an improved inspection method for an IC package that has a pin grid array (PGA) structure, wherein the short or open circuits in respective conductive paths connected to a feeding-side light probe and detection-side pin probes are all tested at the same time.

The sixth invention is characterized by the fact that in the contact type feeding system, a light probe which is a feed control element obtained by laminating a transparent electrode, a light conductive film and an anisotropic conductive rubber is placed on a bonding pad of a pin grid array (PGA), and scanning is performed with a laser beam onto the light conductive film through the transparent electrode so that individual feeding is performed to the respective terminals of the bonding pad, thus eliminating the difficulty of probing narrowly spaced wiring.

DETAILED DESCRIPTION OF THE INVENTION

Preferred embodiments of the respective inventions will be described below with reference to the accompanying drawings.

Embodiment 1

Figure 1:
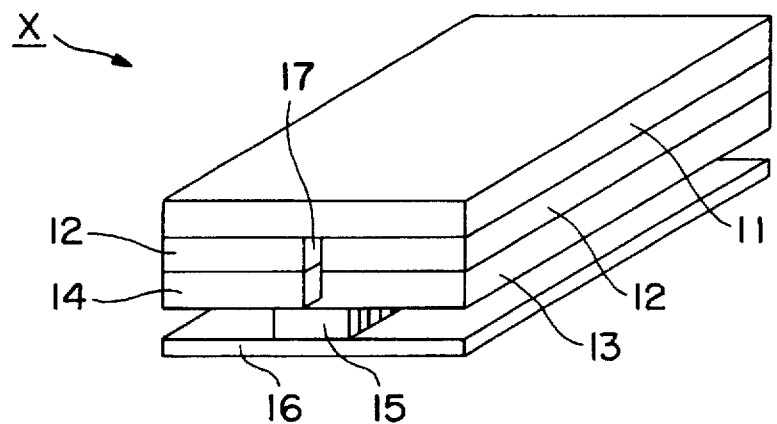
FIG. 1 is an explanatory diagram which illustrates the elemental structure of the feed control element.

FIG. 1 is an explanatory diagram which illustrates the elemental structure of the feed control element. In FIG. 1, 11 is a glass member, 12 is a transparent electrode, 13 is a light conductive film, 14 is a resistance film, 15 is an anisotropic conductor, 16 is an insulator, and 17 is an insulating gap. X indicates the feed control element for substrate inspection.

As shown in FIG. 1, the elemental structure of the feed control element (X) for substrate inspection is that a laminated assembly consisting of the transparent electrode 12 and light conductive film 13 and another laminated assembly consisting of the transparent electrode 12 and resistance film 14 are disposed side by side between the glass member 11, which faces a pulse-modulated laser beam irradiation, and the insulator 16, which faces the circuit pattern; and the respective end surfaces of the two laminated assemblies are disposed with the insulating gap 17 in between. In addition, the anisotropic conductor 15 is installed on the insulator 16 side of the insulating gap 17 so that one end of the insulating gap 17 is closed off by the anisotropic conductor 15. Thus, the feed control element is composed with the following order of lamination: the glass member 11, the transparent electrode 12, the light conductive film 13 and resistance film 14 with the insulating gap 17 in between, the anisotropic conductor 15, and the insulator 16.

Embodiment 2

The feeding method which uses the feed control element (X) as disclosed above is performed as follows: the feed control element (X) is placed at one end of a circuit pattern that is to be inspected so as to form an electrostatic capacitive coupling between the feed control element and the circuit pattern. Then, the light conductive film 13 of the feed control element (X) is scanned through the glass member 11 and transparent electrode 12 with a pulse-modulated laser beam whose light spot is sufficiently smaller than the pitch or trace interval of the circuit pattern, so that individual feeding is performed on the circuit pattern, i.e. so that a voltage is applied to the circuit pattern to be inspected.

The operation (operating sequence) of this method will be described in (1) through (10) below with reference to the model circuit diagram in FIG. 2.

Figure 2:
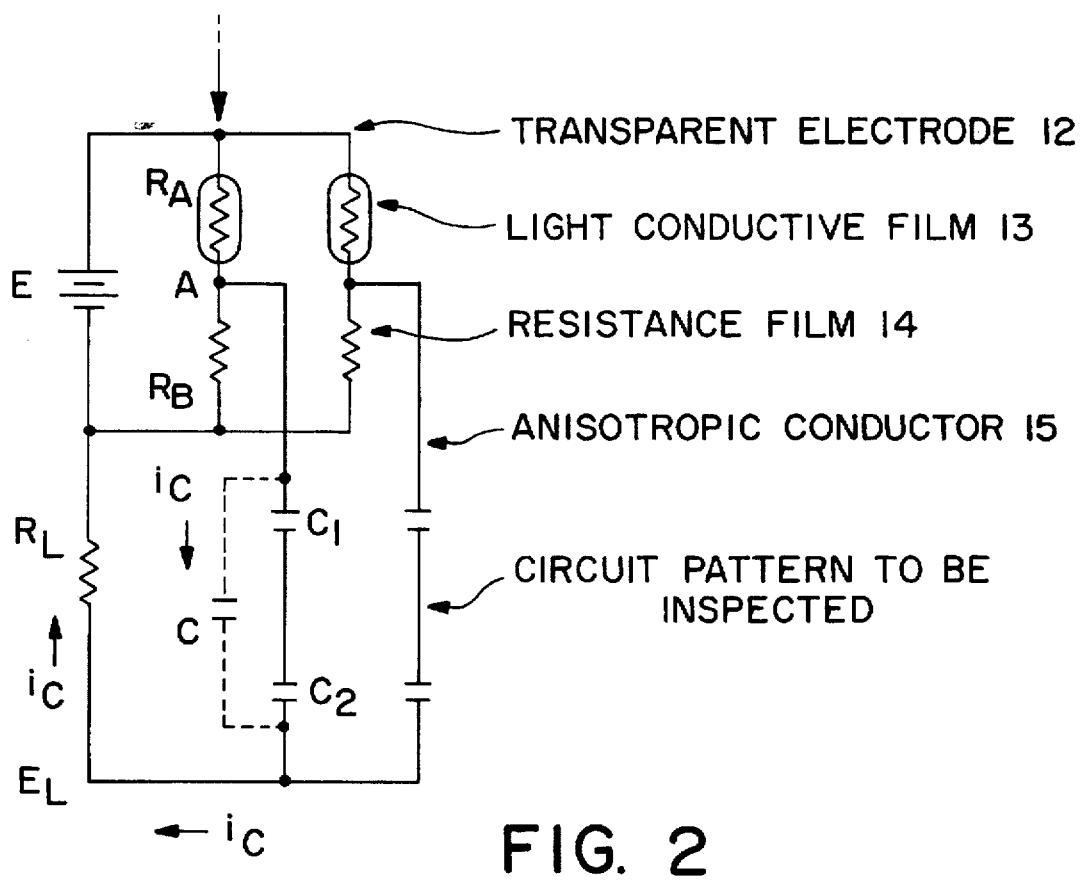
FIG. 2 is a model circuit diagram which is used to illustrate the operating sequence in the feeding method.

(1) When no laser light is applied to the feed control element, the potential $E_A$ at point A in FIG. 2 can be expressed by the following equation:

$$E_A = E \times (R_B/(R_A + R_B))$$

(2) The condensers $C_1$ (on the feeding side) and $C_2$ (on the detection side) are connected in series and therefore may be viewed as a single condenser C (indicated by the dotted line in FIG. 2). Accordingly, when no laser light is applied to the feed control element, the potential on the $R_A$ side of C is $E_A$.

(3) When the laser light strikes the light conductive film ($R_A$), the resistance $R_A$ drops and becomes $R_A'$. The potential $E_A'$ at point A in this case can be expressed by the following equation:

$$E_A' = E \times (R_B/(R_A' + R_B))$$

Here, $R_A$ is larger than $R_A'$ or $R_A > R_A'$, therefore, $E_A$ is smaller than $E_A'$ or $E_A < E_A'$, and the potential at point A increases.

(4) As a result of the generation of this potential difference, the charge of C changes (or positively or negatively displaces), so that an electric current flows toward the condenser C from point A.

(5) This current flows across the conductor plates of the condenser C as a displacement current $i_C$ and further flows through the current detection resistance $R_L$ as a circuit current ($i_C$), thus generating a detection voltage $E_L$.

(6) The displacement current $i_C$ ceases to flow when the charge of the condenser C becomes equal in terms of positive and negative.

(7) Immediately after laser light ceases to be applied, the potential at point A drops.

(8) In this case, a potential difference which is opposite to that described above is generated, and the charge in the condenser C changes, so that an electric current flows toward point A from C.

(9) This current flows across the conductor plates of the condenser C as a reverse displacement current $-i_C$; therefore, a reverse circuit current ($-i_C$) flows through the current detection resistance $R_L$, thus generating a detection voltage $-E_L$.

(10) The displacement current $-i_C$ ceases to flow when the charge of the condenser C becomes equal in terms of positive and negative, and the change described above stops.

The detection voltages ($E_L$, $-E_l$) during the period of the above operation can be plotted in a time chart.

Embodiment 3

The substrate inspection apparatus which includes the feed control element and feeding method as described above in its constituent elements as a technical means is constructed as follows: a feeding side and a detection side are formed by forming respective electrostatic capacitive couplings at both ends of a circuit pattern to be inspected; a voltage is applied to the circuit pattern to be inspected by irradiating the circuit pattern with a pulse-modulated laser beam via the feeding-side electrostatic capacitive coupling; an electrical status of the detection-side electrostatic capacitive coupling is extracted from the circuit; and the status of the respective conductive paths of the circuit pattern to be inspected is tested by subjecting the detected signals to waveform processing.

Figure 3:
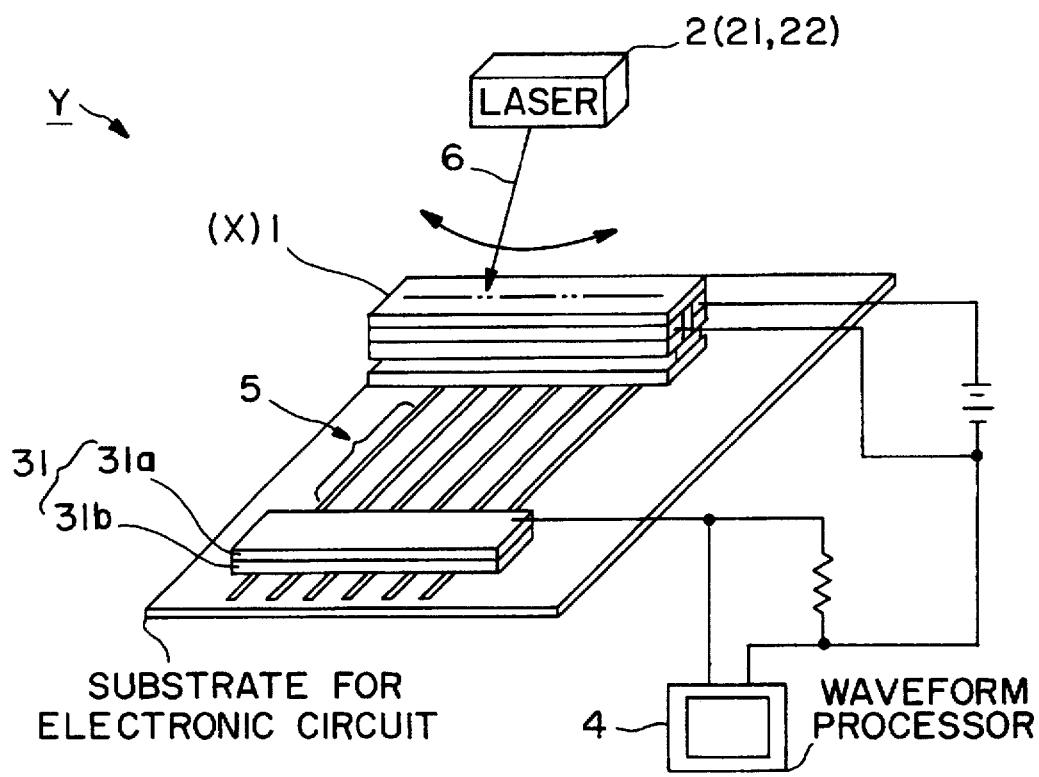
FIG. 3 is a schematic diagram of the construction of a non-contact type substrate inspection apparatus.
Figure 4:
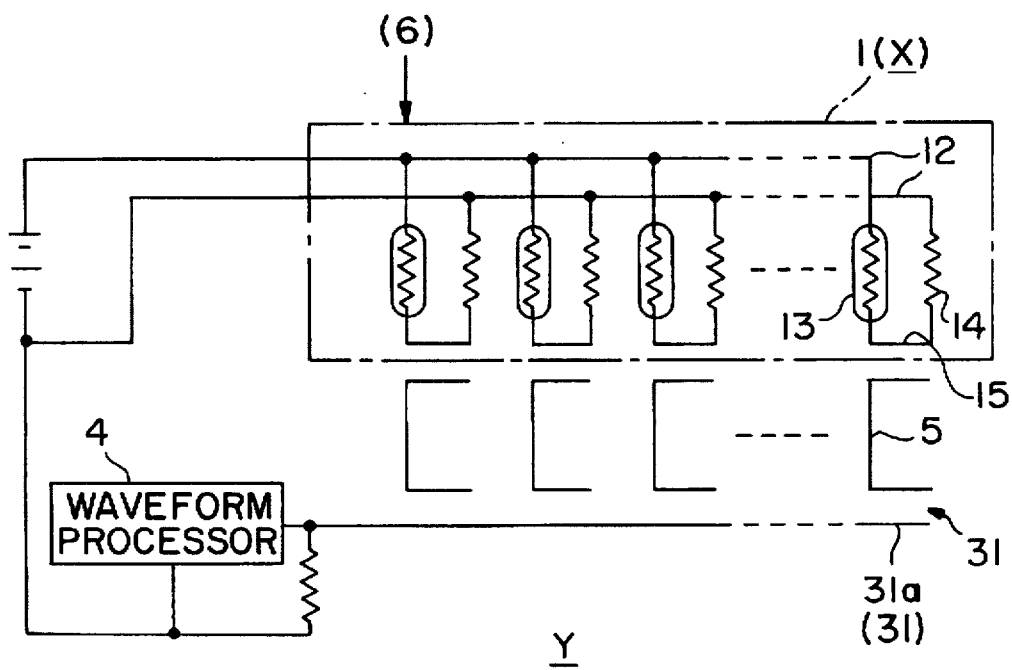
FIG. 4 is an equivalent circuit diagram of the same.

A schematic diagram which illustrates the structure of this apparatus is shown in FIG. 3, and an equivalent circuit diagram is shown in FIG. 4.

Figure 5:
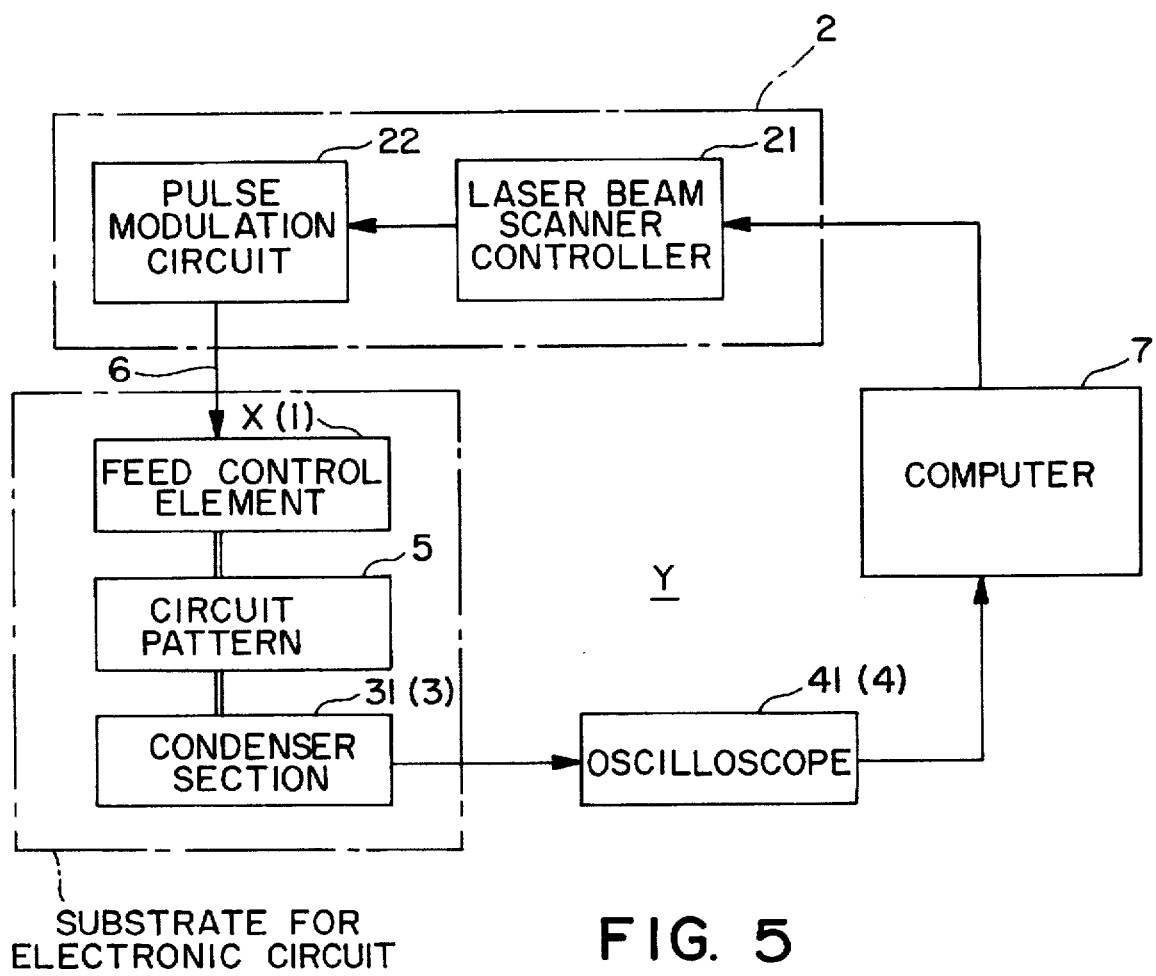
FIG. 5 is a block diagram of an embodiment in which an external computer is connected.

Furthermore, FIG. 5 shows a block diagram of an embodiment in which an external computer is connected to the apparatus.

The characterizing structure of the substrate inspection apparatus (Y) is that it includes: a feed control means 1 for applying a voltage to the circuit pattern 5 which is to be inspected by electrostatic coupling through the feed control element (X) at one end of the pattern 5 to be inspected; a pulse-modulated laser beam irradiation means 2 for scanning the light conductive film 13 of the feed control element (X) through the transparent electrode 12 of the feed control element (X) with a pulse-modulated laser beam 6 whose spot is sufficiently smaller than the pitch of the circuit pattern 5 which is to be inspected; a signal detection means (31; 3) for detecting voltage changes in the circuit pattern 5 by means of an electrostatic capacitive coupling at the other end of the circuit pattern 5; and a waveform processing means 4 for performing waveform processing on the detected signals of the signal detection means (31; 3).

Furthermore, an external computer 7 is connected that executes a pulse-modulated laser beam irradiation control and constitutes a secondary processing system for waveform processing that includes data processing.

Here, the pulse-modulated laser beam irradiation means 2 is a laser beam scan controller 21 and pulse modulation circuit 22; the signal detection means 3 is the condenser 31 which is formed by interposing an insulator 31b between a conductive plate 31a and the circuit pattern 5 that is to be inspected; and the waveform processing means 4 is a waveform processing circuit 41.

Ordinarily, an oscilloscope is used as the waveform processing circuit 41.

The operation of this apparatus (Y) is described as follows: The laser beam scanning controller (21; 2) is controlled by the computer 7 so that the feed control element (X; 1) is scanned by a pulse-modulated laser beam 6, thus causing a voltage to be applied to the circuit pattern 5 that is to be inspected; as a result, the resulting voltage change occurs in the condenser (31; 3) which is on the detection side. This electrical state is extracted from the circuit, and the detected signals are processed by the computer 7 via the waveform processing circuit (41; 4), so that respective output waveforms that are characteristic of any faulty states are displayed on a CRT. Thus, it is possible to judge the status of the conductive path in question.

Here, if there is no short-circuiting, voltage changes indicative of the same current in all circuit patterns are detected.

On the other hand, if there is a short circuit, the surface area of the condenser increases, and the amount of electric current per unit time increases, thus causing an increase in the detection voltage. Furthermore, if there is a wire disconnection, no voltage change is detected.

Figure 6A:
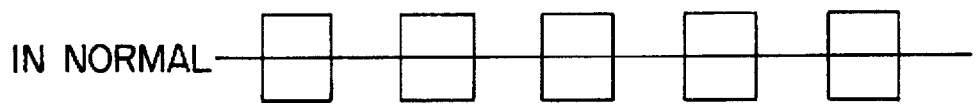
FIGS. 6(a–c) are explanatory diagrams which show output waveforms (upon which waveform processing has been performed).

The output waveforms (upon which waveform processing has been performed) are shown in FIGS. 6(a), (b) and (c). If there is no short-circuiting, voltage changes indicating the same current in all circuit patterns are detected, displaying the waveform as shown in FIG. 6(a).

Figure 6B:
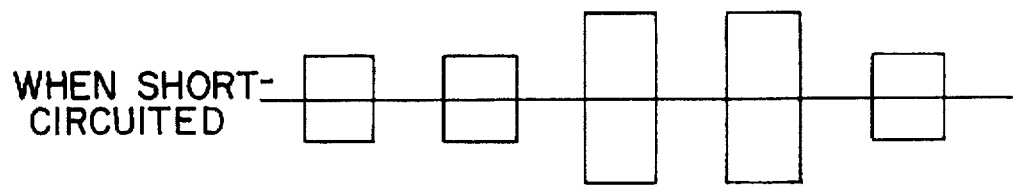

On the other hand, if there is a short circuit, the surface area of the condenser increases (i.e., the amount of current per unit time increases), and the detection voltage increases. Accordingly, the waveform as shown in FIG. 6(b) is displayed.

Figure 6C:
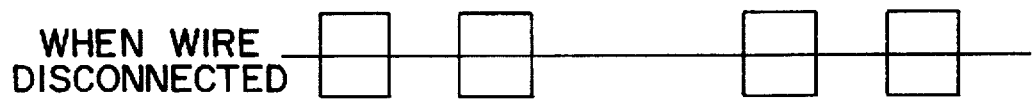

In addition, if there is a wire disconnection, no voltage change is detected, and the waveform as shown in FIG. 6(c) is displayed.

In the structure described above, an electrostatic capacitive coupling is formed between the feeding-side target electrode and the feed control element, and the feed control element is irradiated with a pulse-modulated laser beam, thus establishing non-contact individual feeding. Accordingly, this structure can be used for executing the non-contact type inspection of electronic circuit substrates which have high-density circuit patterns.

The thus improved feeding system eliminates probing problems that have risen in connection with recent electronic circuit substrate development trends and needs. In other words, with this improved feeding system, there is no need to use connection pins or a positioning device, etc. in executing a detection of defects such as short circuits, wire disconnections, etc. in electronic circuit substrates having high-density circuit patterns or a detection of improper mounting of circuit components connected to circuit patterns. In addition, highly reliable substrate inspections can be performed quickly and easily. Furthermore, since the structure of the inspection apparatus can be simple, manufacturing costs can be reduced.

Moreover, on the detection side, the waveform pattern characteristics of faulty states can be judged via visual inspection by watching a CRT screen as a result of waveform processing; therefore, the locations of circuit defects can be ascertained very easily.

Embodiment 4

Meanwhile, the invention can be used for a substrate inspection method which is performed via a contact system. In this case, the invention improves the inspection method for an IC package that is of a pin grid array (PGA) structure. In this method, short or open circuits in conductive paths connected to a light probe which is on the feeding side and a pin probe which is on the detection side are all tested at the same time.

Figure 7:
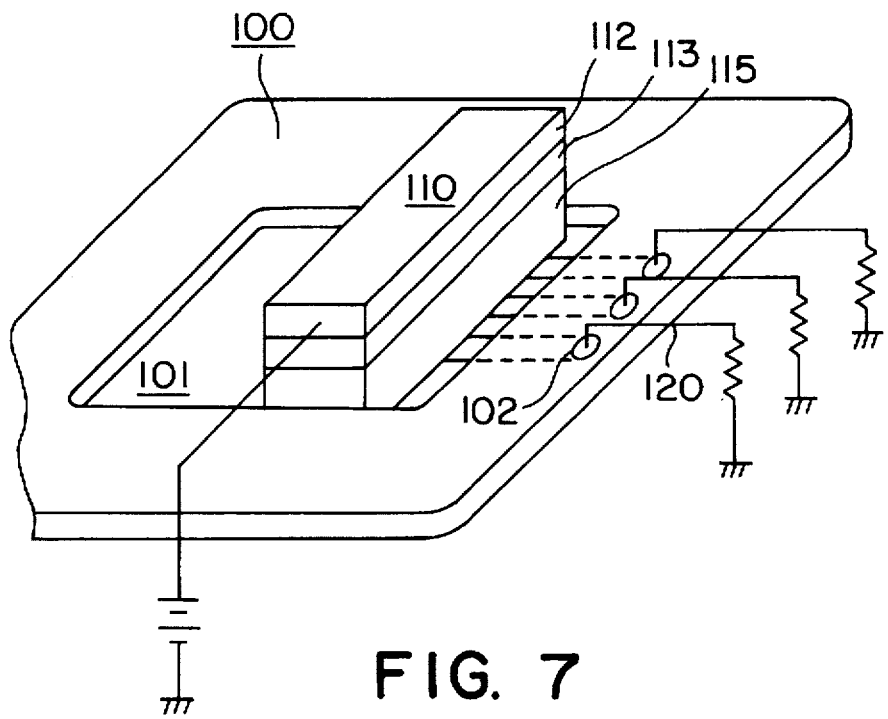
FIG. 7 is a schematic diagram of the structure of a contact type substrate inspection apparatus.
Figure 8:
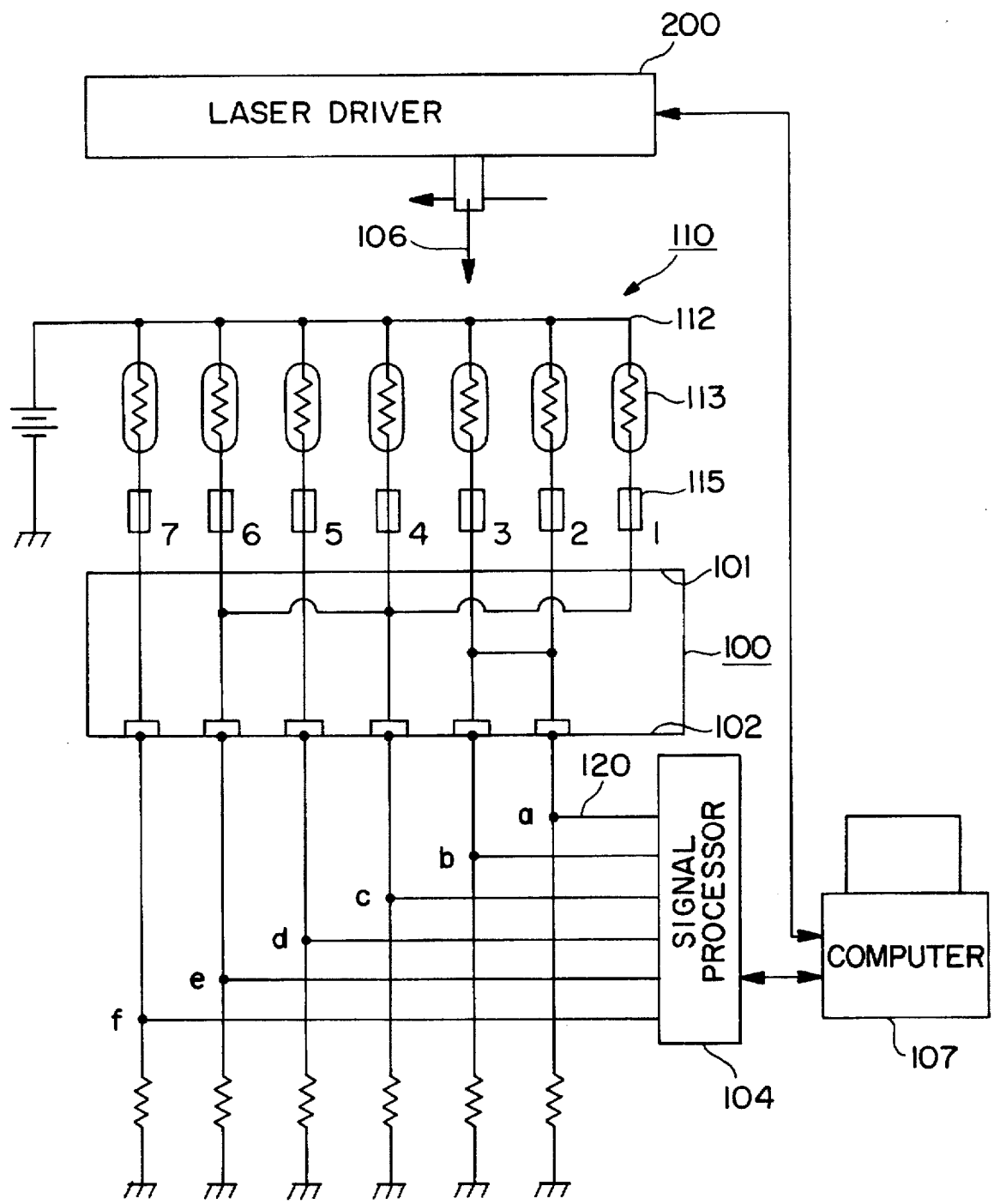
FIG. 8 is an equivalent circuit diagram of the same.
Figure 9:
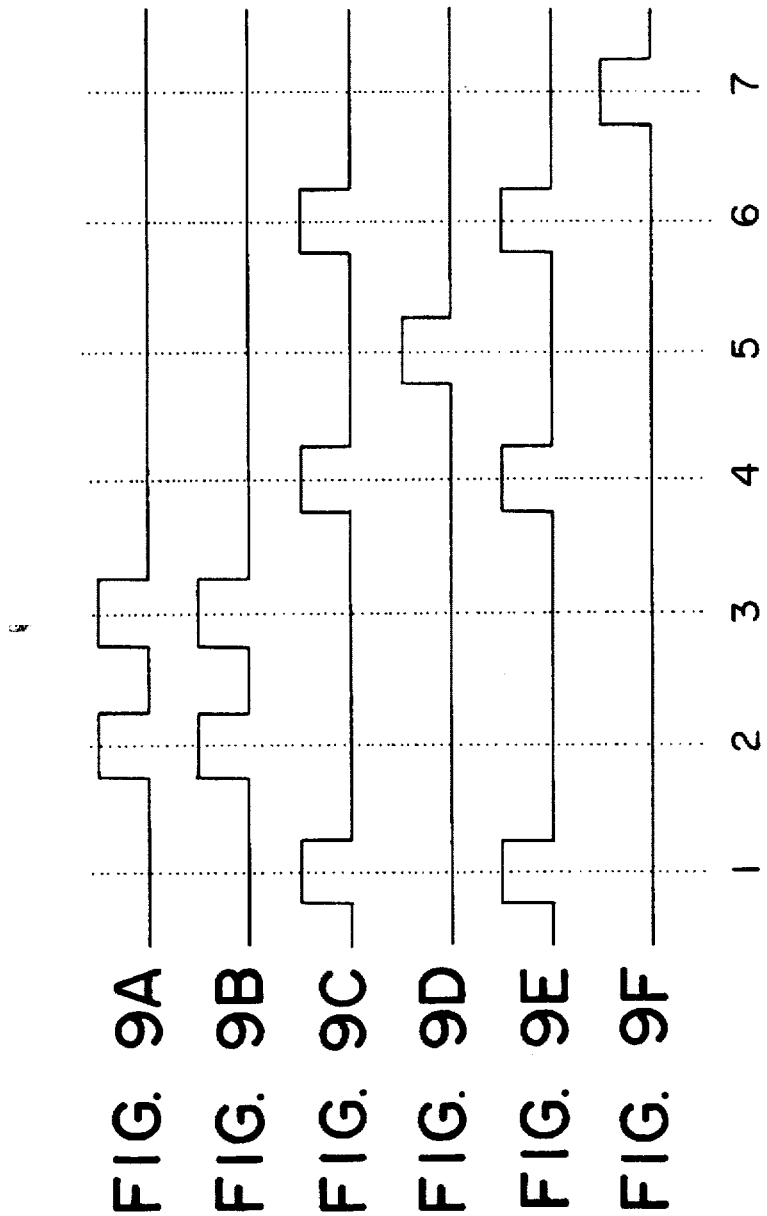
FIGS. 9(a–f) are explanatory diagrams which show output waveforms (upon which waveform processing has been performed).
Figure 10:
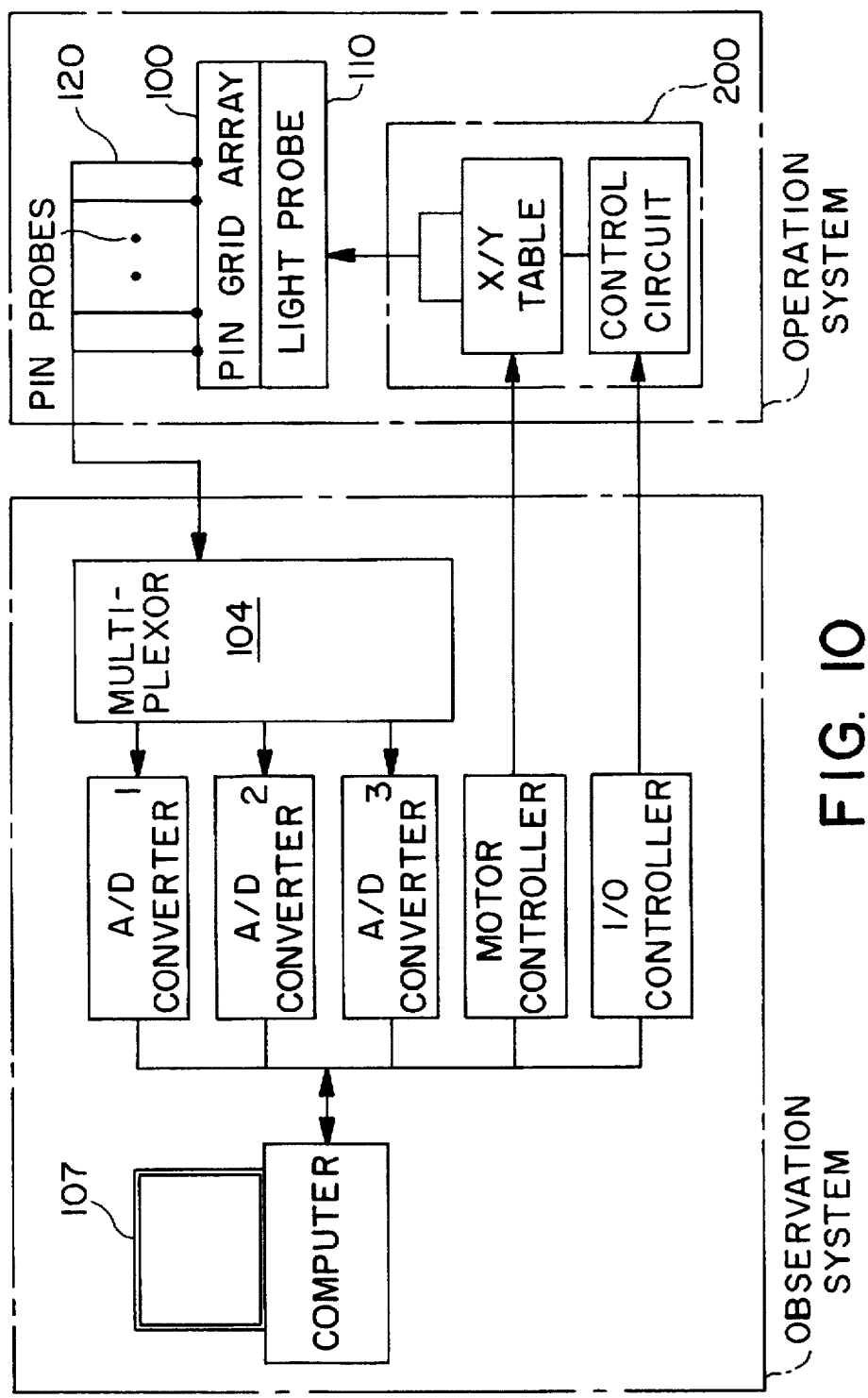
FIG. 10 is a block diagram of an embodiment in which an external computer is connected.

FIG. 7 is a schematic diagram of the structure taken, FIG. 8 is an equivalent circuit diagram, FIG. 9 is an explanatory diagram of output waveforms (upon which waveform processing has been performed), and FIG. 10 is a block diagram of an embodiment in which an external computer is connected.

The characterizing feature is the way feeding is accomplished by the light probe 110. In other words, the light probe 110, in which the feed control element is constituted by laminating a transparent electrode 112, a light conductive film 113 and an anisotropic conductive rubber 115, is placed on bonding pad part 101 of a PGA 100; and respective pin probes 120, . . . 120 are connected to the individual pin pad parts 102, . . . 102. Then, individual feeding to the respective terminals of the bonding pad part 101 is accomplished by scanning the light conductive film 113 of the light probe 110 with a laser beam 106 through the transparent electrode 112.

The electrical status of the pin probes 120 on the detection side is extracted from the circuit, and the status of the respective conductive paths is tested by data processing which is performed on the detected signals using the computer 107 through a signal processing circuit 104.

The laser driving section 200 includes an XY table and a control circuit which are controlled by the computer 107.

According to the method describe above, it is possible to solve the probing problems which, including problems of probe positioning, are derived from an increase in the wiring density (i.e., a narrowing of the terminal pitch) on the feeding side (i.e., in the bonding pad part) when performing an inspection of IC packages which have a pin grid array (PGA) structure, thus satisfying demanding testing requirements.

I claim:

1. A voltage feed control means for a substrate inspection apparatus wherein a non-contact type detection is performed for defects in circuit patterns formed on a substrate and for improper mountings of circuit components connected to circuit patterns, said feed control means being a feed control element which forms an electrostatic capacitive coupling between said feed control element and a circuit pattern that is to be inspected and to individually feed a voltage to each circuit pattern by irradiating the circuit pattern with a pulse-modulated laser beam, wherein said feed control element is formed such that a first laminated assembly, which consists of a first transparent electrode 12 and a light conductive film 13, and a second laminated assembly, which consists of a transparent electrode 12 and a resistance film 14, are installed side by side between a glass member 11, which is provided on a pulse-modulated laser beam irradiation side, and an insulator 16, which is provided on a circuit pattern side; respective end surfaces of said first and second laminated assemblies are separated with an insulating gap 17 in between; and an anisotropic conductor 15 is installed on said insulating gap 17 so as to be located on said insulator 16 side, thus closing off one end of said insulating gap 17, said feed control element being thus constructed as a block unit that has a laminated structure.

2. A substrate inspection method wherein a non-contact type detection is performed for defects in circuit patterns formed on a substrate and for improper mountings of circuit components connected to circuit patterns, said method includes the steps of creating a feeding side and a detection side by providing a respective electrostatic capacitive coupling at both ends of a circuit pattern to be inspected, applying a voltage to said circuit pattern to be inspected by irradiating said circuit pattern with a pulse-modulated laser beam through a feeding-side electrostatic capacitive coupling, detecting as a signal an electrical status of said circuit to be detected that is formed at an electrostatic capacitive coupling on a detection side, and performing waveform processing and testing a status of respective conductive paths of said circuit pattern to be inspected, wherein a feed control element (X) described in claim 1 is installed at one end of said circuit pattern to be inspected, and a pulse-modulated laser beam whose flux of light is sufficiently smaller than a trace pitch of said circuit pattern to be inspected is scanned and radiated onto a transparent electrode of said light conductive film, so that individual feeding to each conductive path of said circuit pattern to be inspected is accomplished.

3. A substrate inspection apparatus wherein a non-contact type detection is performed for defects in circuit patterns formed on a substrate and for improper mountings of circuit components connected to circuit patterns, and said inspection apparatus is designed so that a feeding side and a detection side are formed by respective electrostatic capacitive couplings established at both ends of a circuit pattern to be inspected, a voltage is applied to said circuit pattern to be inspected by irradiating a pulse-modulated laser beam through a feeding-side electrostatic capacitive coupling, an electrical status of said circuit to be detected that is formed at an electrostatic capacitive coupling is detected as a signal, and a status of respective conductive paths of said circuit pattern to be inspected is tested by subjecting detected signals to waveform processing, said substrate inspection apparatus comprising:

a feed control means 1 for applying a voltage to a circuit pattern 5 that is to be inspected by means of said electrostatic capacitive coupling;

a pulse-modulated laser beam irradiation means 2 for scanning and radiating said feed control means 1 with a pulse-modulated laser beam 6 whose spot is sufficiently smaller than a pitch of said circuit pattern 5 to be inspected;

a signal detection means 3 for detecting voltage changes in said circuit pattern 5 by means of said electrostatic capacitive coupling; and a waveform processing means 4 for performing waveform processing on detected signals of said signal detection means 3.

4. A substrate inspection apparatus as defined in claim 3, wherein:

said feed control means 1 is a feed control element (X) which is a single block unit formed by laminating a glass member 11, a transparent electrode 12, a light conductive film 13 and a resistance film 14 having an insulating gap 17, an anisotropic conductor 15 and an inslator 16;

said pulse-modulated laser beam irradiation means 2 comprises a laser beam scanning controller 21 and a pulse modulation circuit 22;

said signal detection means 3 is a condenser 31 which is formed by interposing an insulator 31b between a conductive plate 31a and said circuit pattern 5 to be inspected; and said waveform processing means 4 is a waveform processing circuit 41.

5. A substrate inspection apparatus as defined in claim 3 or 4, which is equipped with an external computer 7 which is connected to said laser beam scanning controller 21 and waveform processing circuit 41, so as to control irradiation of pulse-modulated laser beam 6 and to constitute a secondary processing system for waveform processing that includes data processing.

6. An inspection method for IC packages which have a pin grid array (PGA) structure in which short or open circuits in respective conductive paths connected to a feeding-side light probe via detection-side pin probes are all tested at the same time, wherein a light probe, in which a feed control element, which is a block unit constituted by laminating a transparent electrode, a light conductive film and an anisotropic conductive rubber, is placed on a bonding pad part of a pin grid array (PGA), respective pin probes are connected to individual pin pad parts, individual feeding to respective terminals of said bonding pad part is accomplished by scanning said light conductive film of said light probe with a laser beam through said transparent electrode of said light probe, an electrical status of a circuit to be detected generated in said pin probes on a detection side is detected as a signal from said circuit, and a status of the respective conductive paths is tested by displaying an output wave form and by performing, with a computer, a data processing on detected signals through a signal processing circuit of said computer.

* * * * *